United States Patent
Dhong et al.

(10) Patent No.: US 7,610,531 B2
(45) Date of Patent: Oct. 27, 2009

(54) MODIFYING A TEST PATTERN TO CONTROL POWER SUPPLY NOISE

(75) Inventors: Sang H. Dhong, Austin, TX (US); Brian Flachs, Georgetown, TX (US); Gilles Gervais, Austin, TX (US); Brad W. Michael, Cedar Park, TX (US); Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/531,287

(22) Filed: Sep. 13, 2006

(65) Prior Publication Data

US 2008/0082887 A1  Apr. 3, 2008

(51) Int. Cl.
 *G01R 31/28* (2006.01)
(52) U.S. Cl. .................. 714/724; 714/726; 714/728; 714/729; 714/738; 714/739
(58) Field of Classification Search .............. 714/724, 714/726, 728, 729, 738, 739
See application file for complete search history.

(56) References Cited

U.S. PATENT DOCUMENTS 6,031,362 A * 2/2000 Bradley ................. 323/269
6,807,645 B2 10/2004 Angelotti et al.
6,901,546 B2 5/2005 Chu et al.
7,055,077 B2 5/2006 Kiryu et al.
7,135,895 B2 * 11/2006 Komura ................ 327/108

OTHER PUBLICATIONS

Nourani et al., Pattern Generation and Estimation for Power Supply Noise Analysis, 2005, IEEE, pp. 1-6.*
Baker et al., Interconnect Test Pattern Generation Algorithm For Meeting Device and Global SSO Limits With Safe Initial Vectors, 2004, IEEE, paper .2, pp. 163-172.*
Miczo, Alexander, Digital Logic Testing and Simulation (Second Edition), Aug. 29, 2003, $2^{nd}$, pp. 451-512.*

* cited by examiner

Primary Examiner—Jacques H. Louis Jacques
Assistant Examiner—John J Tabone, Jr.
(74) Attorney, Agent, or Firm—Stephen J. Walder, Jr.; Matthew B. Talpis (57) ABSTRACT

Mechanisms for modifying a test pattern to control power supply noise are provided. A portion of a sequence of states in a test sequence of a test pattern waveform is modified so as to achieve a circuit voltage, e.g., an on-chip voltage, which approximates a nominal circuit voltage, such as produced by the application of other portions of the sequence of states in the same or different test sequences. For example, hold state cycles or shift-scan state cycles may be inserted or removed prior to test state cycles in the test pattern waveform. The insertion/removal shifts the occurrence of the test state cycles within the test pattern waveform so as to adjust the voltage response of the test state cycles so that they more closely approximate a nominal voltage response. In this way, false failures due to noise in the voltage supply may be eliminated.

21 Claims, 6 Drawing Sheets

MODIFYING A TEST PATTERN TO CONTROL POWER SUPPLY NOISE

BACKGROUND

1. Technical Field

The present application relates generally to an improved data processing system and method. More specifically, the present application is directed to a system and method for modifying a test pattern so as to control power supply noise during testing of an integrated circuit device. In particular, the system and method of the illustrative embodiments set forth hereafter are directed to controlling power supply noise during testing so as to provide a more accurate determination of a minimum functional voltage of an integrated circuit device when compared to known techniques.

2. Description of Related Art

Testing of integrated circuit devices is an important factor in ensuring proper functionality of the integrated circuit devices as well as for determining the functional capabilities of the integrated circuit devices for categorization purposes, e.g., binning. As integrated circuit devices have become more complex, in an effort to reduce the complexity and cost of the external testing equipment, testing of the integrated circuit devices has moved from the exclusive use of external testing equipment to greater dependence on built-in-self-test (BIST) circuitry provided on the integrated circuit device itself. Such BIST circuitry may be used to test the functional logic of the integrated circuit device, i.e. LBIST, arrays of the integrated circuit device, i.e. ABIST, or the like.

Typically, with LBIST circuitry provided on the integrated circuit device, a test pattern generator generates a test pattern that is applied to the functional logic of the integrated circuit device, or circuit under test (CUT), which in turn outputs a response to a response analyzer that generates a signature based on the analyzed response. With LBIST, all of the logic on the integrated circuit device is tested using a large number of test patterns to ensure a high test coverage. The resultant data generated by the logic of the integrated circuit device is captured in "strings" of output latches of the integrated circuit device. This data is combined to form one signature which depends on values of all the individual latch bits. This signature is updated after each test so that, in the end, the final signature depends on the values of all the latch bits as determined after all tests.

The correct signature can be determined by simply running the tests at low frequency where all of the logic is expected to operate correctly. The test signature generated from this low frequency testing is referred to as the "golden signature." This golden signature is then used to compare against signatures obtained as the test frequency is increased. The integrated circuit device is typically divided up into many different scan "strings" with each one having its own golden signature and subsequent test signatures.

By performing such testing of the functional logic of an integrated circuit device using LBIST, various operational characteristics of the integrated circuit device may be calculated. One such operational characteristic is the minimum functional voltage of the integrated circuit device, i.e. Vminf. A problem arises, however, when using LBIST to determine Vminf in that the integrated circuit device does not operate in an idealized manner in which the voltage inside the integrated circuit device, i.e. the on-chip voltage Vdd, is at a constant voltage at all times. To the contrary, the on-chip voltage Vdd is a complex function involving characteristics of the power supply (e.g., resistance, capacitance, inductance at the chip, package, and board levels, etc.) and the current-vs-voltage characteristics of the circuits on the chip, i.e. in the integrated circuit device.

One reason why the integrated circuit device does not operate in an idealized manner is that the execution of the test patterns in the functional logic is controlled by an LBIST controller which controls various signal switching events for specifying the operational state of the functional logic for each functional cycle. The various signal switching events used to control the operational state of the functional logic for each cycle during the LBIST result in various current draws from the on-chip capacitance and from higher levels of the power supply (e.g., package, board, voltage regulator, etc.).

Short term excess of current demand over average will reduce the voltage in the on-chip capacitance. Short term current demand which is less than average will result in increased charge stored in the on-chip capacitance. Thus, as the states of the LBIST change, the voltage in the on-chip capacitance changes thereby possibly causing droops in the on-chip voltage Vdd. Such changes in the on-chip voltage Vdd from an idealized constant voltage is referred to as power supply noise. If the on-chip voltage Vdd droops too far, i.e. the power supply noise is too great, the corresponding test may fail.

Thus, depending upon the sequence of states used for the particular tests, certain tests may fail at different external voltages from the voltage supply. Since such tests may be used to determine Vminf, these tests may indicate a Vminf that is greater than is actually required due to the failure of certain tests. Thus, there is an uncertainty in the determination of the Vminf calculated using such LBIST in the known technology.

SUMMARY

In one illustrative embodiment, a method for testing an integrated circuit device is provided. The method comprises determining a voltage response of the integrated circuit device to a test state sequence and modifying a test pattern waveform, based on the determined voltage response so as to reduce noise in the voltage response during the test state sequence, by modifying a configuration bit string provided as an input to a logic built-in self test controller associated with the integrated circuit device. The method further comprises applying the modified test pattern waveform to the integrated circuit device and determining a minimum functional voltage for the integrated circuit device based on the application of the modified test pattern waveform.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, an apparatus is provided. The apparatus may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism by which test patterns may be modified to control power supply noise for more accurate determination of the minimum functional voltage (Vminf) of an integrated circuit device, such as an integrated circuit chip, for example. The mechanism of the illustrative embodiments may be implemented in a single computing device or may be distributed across a plurality of computing devices in communication with one another via one or more data networks. For example, a client computing device may communicate with a server computing device, via one or more data networks, in order to provide the server computing device with an model of an integrated circuit device that may be simulated and tested in accordance with the illustrative embodiments of the present invention as set forth hereafter.

Figure 1:
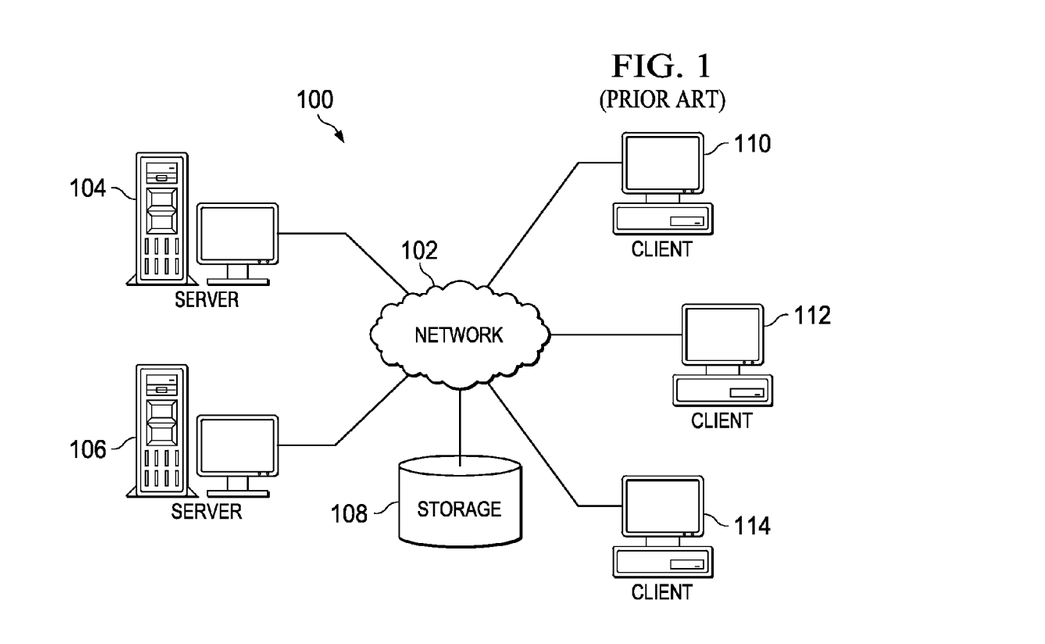
FIG. 1 is an exemplary diagram of a distributed data processing system in which exemplary aspects of the illustrative embodiments may be implemented.
Figure 2:
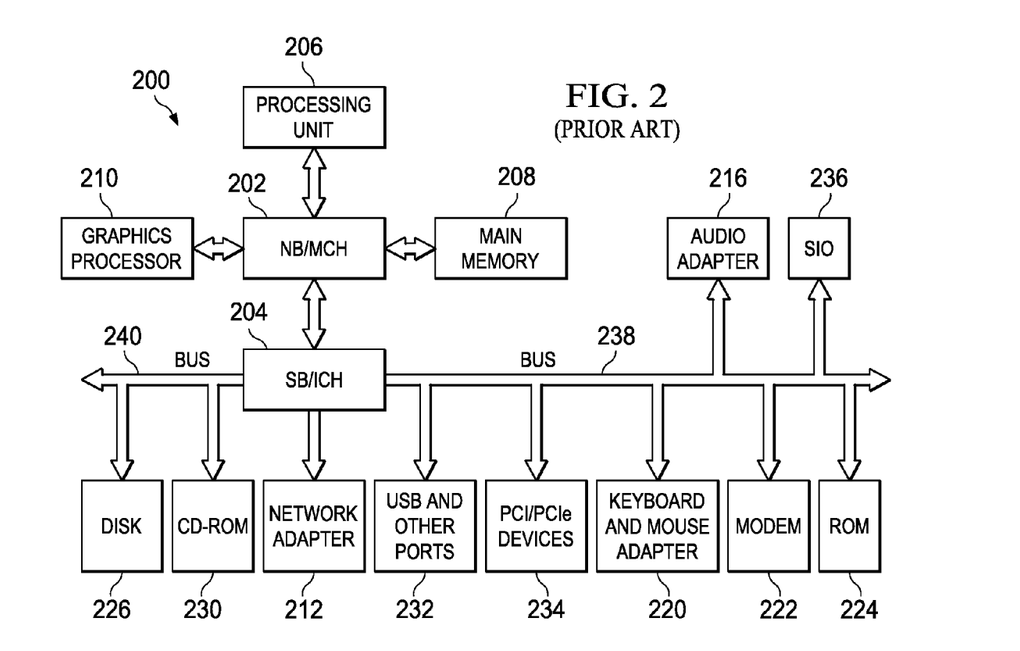
FIG. 2 is an exemplary block diagram of a data processing device in which exemplary aspects of the illustrative embodiments may be implemented.

With reference now to the figures and in particular with reference to FIGS. 1-2, exemplary diagrams of data processing environments are provided in which illustrative embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as hosts 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft ® Windows ® XP (Microsoft and Windows are trademarks of Microsoft Corporation in the United States, other countries, or both). An object-oriented programming system, such as the Java ™ programming system, may run in conjunction with the operating system and provides calls to the operating system from Java ™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

With the mechanisms of the illustrative embodiments, a client computing device, such as client computing device 110 may provide an integrated circuit device model to a server computing device, such as server 104. Alternatively, the client computing device 110 may communicate with the server computing device 104 to design an integrated circuit device model. In either case, the server computing device 104 may provide software/hardware mechanisms for performing simulation and testing of the integrated circuit device model in accordance with the illustrative embodiments described hereafter. In particular, the testing performed by the mechanisms of the server computing device 104 may involve controlling the sequence of states used to apply a test pattern. Such control may involve modifying a test pattern waveform specified by a configuration bit string so as to provide additional hold or scan-shift cycles prior to testing cycles, or to remove hold or scan-shift cycles from the test pattern waveform. This insertion (or removal) of hold or scan-shift cycles helps to cancel out affects on on-chip voltage during test cycles by current draws during test setup cycles.

It should be appreciated that with such an embodiment, the testing performed is via simulation of the integrated circuit device based on selected test pattern inputs to the simulation. The mechanisms of the illustrative embodiments may simulate the operation of the integrated circuit device as well as the on-chip voltage response to various current draws of various cycles of operation of the integrated circuit device. Thus, the integrated circuit device model provided by the client computing device 110 may include a logic model, a power or on-chip voltage model, and the like.

By way of the operation of the mechanisms of the illustrative embodiments, a testing pattern, e.g., the sequence of states of the testing pattern waveform, may be adjusted based on the results of simulation of the operation of the integrated circuit device and its simulated on-chip voltage response to the test pattern so as to reduce power supply noise. In this way, a test pattern is generated that provides a more accurate determination of the minimum functional voltage (Vminf) due to the reduction in power supply noise that may otherwise cause the Vminf to be determined to be higher than actually required.

The above empirical implementation of the illustrative embodiments may be performed iteratively. That is, a test pattern sequence may be applied to the integrated circuit device, the on-chip voltage may be measured via sense lines of the integrated circuit device using an oscilloscope, or the like, and the pass/fail status of the test may be monitored to check the Vminf. Based on the measured response, the test pattern sequence may be modified in the manner set forth by the illustrative embodiments herein and the modified test pattern sequence may then be applied to the integrated circuit device. The operation may then be repeated until a desired result is achieved.

Figure 3A:
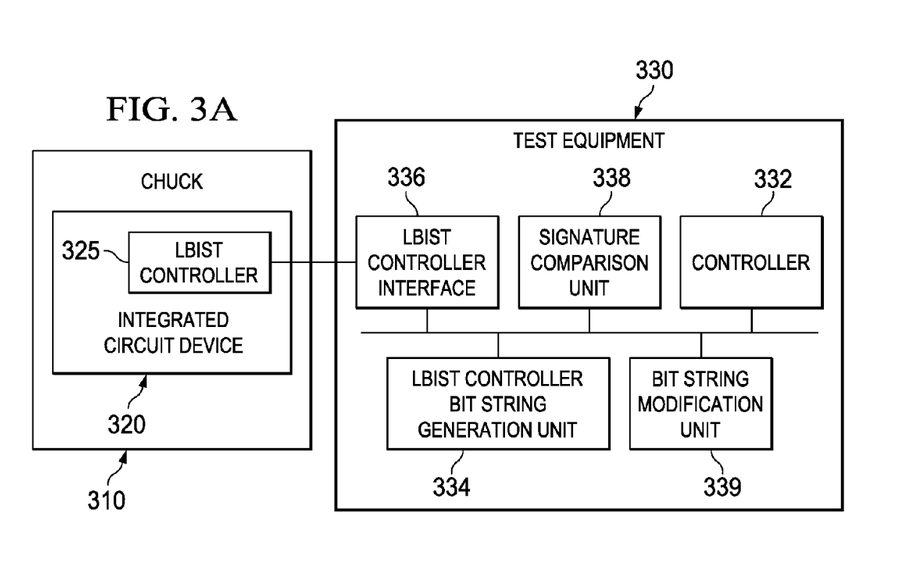
FIG. 3A is an exemplary block diagram of the primary operational components used for LBIST testing in accordance with one illustrative embodiment.

In an alternative embodiment, the mechanisms of the illustrative embodiments may be utilized during physical testing of a fabricated integrated circuit device. For example, the mechanisms of the illustrative embodiments may be used to modify a test pattern used in logic built-in self test (LBIST) testing of the integrated circuit device after fabrication. FIG. 3A is an exemplary block diagram of the primary operational components used for LBIST testing in accordance with one illustrative embodiment. As shown in FIG. 3A, the exemplary testing mechanism includes a temperature controlled chuck 310 upon which an integrated circuit device 320 may be provided, testing equipment 330 for interfacing with an LBIST controller 325 for controlling the application of testing patterns to the functional logic of the integrated circuit device.

The testing equipment 330 comprises a controller 332, an LBIST controller bit string generation unit 334, an LBIST controller interface 336, a signature comparison unit 338, and a bit string modification unit 339. The controller 332 controls the overall operation of the testing equipment 330 and orchestrates the operation of the other elements 332-339. The LBIST controller bit string generation unit 334 generates a configuration bit string for controlling the operation of the LBIST controller 325 of the integrated circuit device 320. The configuration bit string specifies that the LBIST run uses a particular state sequence selected from a number of predefined sequences, as described hereafter, the cycle count and waveform for test control signals within each state, and other parameters that are not pertinent to the specific mechanisms of the illustrative embodiments.

The generated configuration bit string is provided to the LBIST controller 325 via the LBIST controller interface 336. A signature generated as a result of the application of a test pattern by the LBIST logic is obtained from the integrated circuit device 320 via the LBIST controller interface 336 and provided to the signature comparison unit 338 of the testing equipment 330 for comparison to a desired signature in order to verify proper operation of the logic of the integrated circuit device 320.

In addition, on-chip voltage data may be measured via voltage sense lines, for example, and voltage probes such that the on-chip voltage response to current draws of the integrated circuit device logic during testing may be measured and provide to the testing equipment 330 via the LBIST controller interface 336. This on-chip voltage response may be stored by the testing equipment 330 and used by the bit string modification unit 339 to modify the configuration bit string provided to the LBIST controller 325 so as to control a sequence of states of an applied test pattern to allow for an on-chip voltage response to rebound before making additional current draws during subsequent testing cycles that may cause the on-chip voltage response to droop below a threshold where a failure is determined. In other words, the bit string modification unit 339 modifies the configuration bit string such that the sequence of states specified by the bit string includes additional hold or scan-shift state cycles that permit the on-chip voltage (Vdd) response to rebound and thereby reduce the power supply noise during LBIST testing.

Alternatively, hold or scan-shift state cycles prior to the test state cycles of the test pattern sequence may be removed to thereby align the test state cycles to coincide with a maximum or peak on-chip voltage (Vdd) response. In either case, i.e. insertion or removal of hold or scan-shift state cycles, the modifications to the test pattern sequence attempt to minimize the deviation of the on-chip voltage (Vdd) response from a nominal on-chip voltage that is determined based on prior test portions of the same test pattern sequence, other test pattern sequences, a predetermined nominal on-chip voltage, or the like.

In one illustrative embodiment, the bit string modification unit 339 may analyze the on-chip voltage response and computationally determine how to modify the cycles in the test pattern sequence so as to minimize the on-chip voltage (Vdd) deviation from a nominal on-chip voltage. With such a mechanism the on-chip voltage response is considered to be a series of voltage responses to impulse current draws. Because the impulse response eventually dies out, the on-chip voltage (Vdd) during the test state cycles of the test pattern sequence are affected by a reasonably short prior interval. Thus, it is possible to minimize the on-chip voltage (Vdd) deviation from nominal at a particular point in the test pattern sequence by using the following. Let $Vt=Vdd$ at test=$Vnominal+SUM(Ai*R(t-i))$, where $Ai$ is an amplitude coefficient for current draw at cycle $i$ in the prior interval, $R(t-i)$ is the impulse response (normalized) at time $t-i$ after the impulse. The quantity $(Vt-Vnominal)^2$ as follows:

$$\text{partial } (Vt-Vnominal)^2/\text{partial } Ai = 2(\text{SUM}(Aj*R(t-j))) *R(t-i)=0 \text{ for all } i.$$

The resulting matrix equation is solved, and the Ai values are quantized to the available values for scan-shift, Hold, and possibly non-scan flush state cycles (these cycles are discussed hereafter). As a result, the quantized state cycles may be inserted/removed prior to the test scan cycles of the test pattern sequence so as to achieve the desired substantially nominal voltage response during the test scan cycles.

Figure 3B:
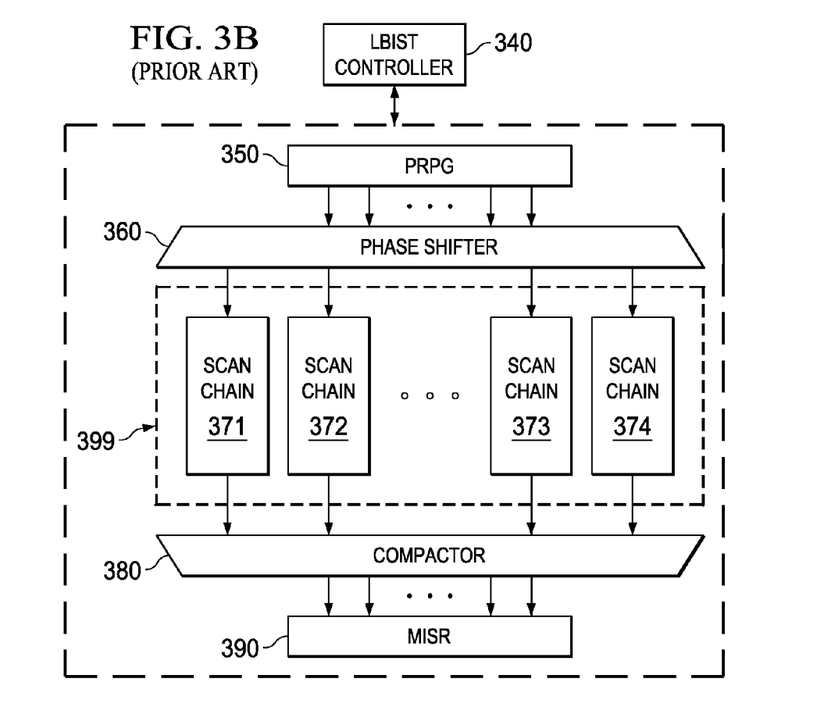
FIG. 3B is an exemplary block diagram of LBIST logic of an integrated circuit device for performing LBIST testing in accordance with one illustrative embodiment.

FIG. 3B is an exemplary block diagram of LBIST logic of an integrated circuit device for performing LBIST testing in accordance with one illustrative embodiment. As depicted in FIG. 3B, the LBIST logic comprises an LBIST controller 340, a Pseudo-Random Pattern Generator (PRPG) 350, a phase shifter 360, a set of scan chains 371-374, a compacter 380 and a multiple input signature register (MISR) 390. These LBIST components are integrated with a logic circuit 399, which the LBIST components are designed to test.

LBIST controller 340 includes control circuitry that controls the operation of the remainder of the LBIST components. For purposes of clarity, the LBIST controller 340 is depicted as being coupled to the LBIST components as a group, although the LBIST controller 340 is typically coupled directly to each of the components. One of the functions of LBIST controller 340 is to provide a seed value to PRPG 350. Based upon this seed value, PRPG 350 generates a pseudorandom sequence of bits that are processed by phase shifter 360 and loaded into scan chains 371-374. The LBIST controller 340 controls the manner by which this pseudorandom sequence of bits are loaded into the scan chains 371-374 by way of a sequence of cycle states determined based on the configuration bit string provided as an input to the LBIST controller 340, as described hereafter.

The purpose of the pseudorandom sequence of bits generated by PRPG 350 is to provide a set of input bits to be propagated through the functional logic components of logic circuit 399. The pseudorandom sequence is therefore provided to each of the scan chains 371-374. It should be noted, however, that the pseudorandom bit sequence is loaded into scan chains 371-374 only after being processed by phase shifter 360.

It should be noted that, while only four scan chains 371-374 are depicted in the FIG. 3B, there may be many scan chains in the LBIST design. If more scan chains are included in the design, more fine-grained testing of the logic circuit can be performed. In other words, if there are more scan chains in the design, fewer of the components of the logic circuit are positioned between successive scan chains.

The phase shifter 360 makes the character of the bit sequence loaded into the scan chains 371-374 more random. That is, the phase shifter 360 shifts the phase of the pseudorandom sequence of bits so that an identifiable pattern within succeeding bit sequences of different scan chains is not present. Essentially, phase shifter 360 operates by shifting the phase of each succeeding column with respect to the preceding column. In other words, rather than being offset by a single bit in each succeeding column, the bit patterns in succeeding columns are shifted by different amounts. This improved randomization of the pseudorandom bit sequence which is loaded into scan chains 371-374 can improve the fault coverage and effectiveness of the LBIST testing. While not essential to the test architecture, phase shifter 360 therefore improves the operation of the test circuitry.

The pseudorandom bit patterns that are generated by PRPG 350 and phase shifter 360 are loaded into scan chains 371-374. Each of scan chains 371-374 comprises a series of scan latches that are configured to alternately shift data (the pseudorandom bit patterns or functional logic output) through the scan chains or to hold data that has been propagated through the functional logic.

As indicated above, a separate sequence is loaded into each of scan chains 371-374. Each of scan chains 371-374 is positioned before or after (interposed with) respective portions of logic circuit 399. Thus, for each portion of logic circuit 399, there is a scan chain which precedes this portion and provides inputs to the corresponding logic, as well as a scan chain which follows this portion and receives the output of the corresponding logic. The scan chains thereby define "levels" of the logic circuit (portions of the logic circuit between successive scan chains). For example, one level of logic circuit 399 may receive input bits from scan chain 371 and provide output bits to scan chain 372. Similarly, another level of logic circuit 399 may receive input bits from scan chain 373 and provide output bits to scan chain 374. It should be noted that some of scan chains 371-374 may serve both to provide input bits to a succeeding level of logic circuit 399 and to receive output bits from a preceding level of logic circuit 399.

After the pseudorandom bit patterns have been allowed to propagate through the functional components of logic circuit 399 and the results have been captured in scan chains 371-374, the contents of scan chains 371-374 are scanned out of the scan chains (i.e., they are unloaded from the scan chains) to compactor 380 and MISR 390. The purpose of compactor 380 is simply to reduce the number of bits that have to be handled by MISR 390. Compactor 380 may be implemented in a number of ways. Typically, the compactor 380 employs a series of XOR gates, where the output of each XOR gate is based upon inputs received from a pair of scan chains. The number of bits that are then passed to MISR 390 can therefore be reduced by a factor of 2. In alternative environments, more complex circuitry may allow the number of bits to be reduced by an even greater factor.

After the bits from scan chains 371-374 have been compacted by compactor 380, they are provided to MISR 390. MISR 390 provides a means to observe the resulting data bits and to compare this information to the expected output of the test system. Typically, rather than comparing the output of scan chains 371-374 (and/or compactor 380) after each functional cycle (during which data is propagated through the functional components of logic circuit 399), MISR 390 enables the observation of a cumulative value that is based upon the output of the scan chains at each cycle. For example, in one embodiment, MISR 390 performs a modulo operation on the output of compactor 380. That is, MISR 390 divides the current value stored in MISR 390 by the output of compactor 380, and retains the remainder from this computation. This computation is performed, and the value stored in MISR 390 is updated, after each functional cycle. After a predetermined number of functional cycles, the value stored in MISR 390 is compared to an expected value. If the stored value does not match the expected value, then one or more of the operations performed by the functional components of logic circuit 399 failed, thereby providing an incorrect data bit in the output scan chain, which is then propagated through compactor 380 to MISR 390.

As mentioned above, the loading of the pseudorandom bit pattern into the scan chains 371-374 is performed under the control of the LBIST controller 340 which specifies, via test control signals, an operational state for each testing cycle based on the configuration bit string input to the LBIST controller 340 from the testing equipment 330. The various states that may be associated with a particular testing cycle may be either a hold (H) state, a scan-shift (S) state, a fill (F) state, and an active (A) state.

The hold (H) state forces all latches in the scan chains 371-374 to retain their current state. The scan-shift (S) state forces all scannable latches in the scan chains 371-374 to update (at the clock edge) from the state held by the prior latch in the scan chain 371-374. The non-scannable latches are forced to hold their state.

The fill (F) state forces scannable latches to hold or retain their current state while non-scannable latches update (at the clock edge) from their normal logic input. The active (A) state allows latches (scannable and non-scannable) to update (at the clock edge) from their data inputs or to hold state if selected to do so by the normal logic function.

These states may be combined in various patterns of state cycles into state sequences in order to perform various testing of the functional logic of the logic circuit 399. For example, a SCAN state sequence, Non-Scan FILL (NSFILL) state sequence, TEST state sequence, and NOOP state sequence may be defined as being different patterns of state cycles. For example, a SCAN state sequence may be utilized in which the results of a prior TEST state sequence are scanned out and stimulus data for a next TEST state sequence may be scanned-in to the scan chains 371-374. The configuration of such a SCAN state sequence may specify, for example, one scan shift and several hold operations repeated a number of times. For example, the control waveform for a SCAN state sequence may be [SHHHHHHHSHHHHHHHSHH . . . HHSHHHHHHHS], e.g., one scan shift every 8 cycles for 3000 total scan shifts.

The NSFILL state sequence may initialize the state of non-scannable latches and may have a typical control waveform of [HFFFH], for example. The TEST state sequence may perform an at-speed logic test of the logic circuit 399 and may have a typical control waveform of [SAAAAH], for example. The NOOP state sequence may be used to insert some number of extra hold cycles.

It is these waveforms for the various states that may be modified by the mechanisms of the illustrative embodiments so as to include additional hold and/or scan-shift states for allowing time for an on-chip voltage response to rebound so as to avoid power supply noise droops that may register false failures. The waveforms may be modified by modifying the configuration bit string provided to the LBIST controller 340, for example, via the bit string modification unit 339 of the testing equipment.

The state cycles each have their own current draw on the power supply to the integrated circuit device. The current draw causes on-chip voltage (vdd) to droop. If a number of cycles occur that have states which cause significant current draws and thus, significant drain on the supply voltage, then the on-chip voltage may droop below a threshold at which a failure of the integrated circuit device is determined to have occurred. Such current draws by test setup states may affect on-chip voltage during test cycles thereby causing the test cycles to register a failure when they otherwise would not have failed if the test setup states were not performed immediately prior to the test cycles. Thus, if additional cycles are inserted (or removed) prior to test cycles, and possibly after test setup cycles, additional time is provided for the on-chip voltage to rebound such that the subsequent test cycles will not be adversely affected by the current draws of the test setup cycles.

Whether performed during simulation or during physical testing of the integrated circuit device, the illustrative embodiments provide a system and method for modifying test patterns so as to control power supply noise for more accurate determination of the minimum functional voltage (Vminf) of the integrated circuit device. With the system and method, a portion of a test pattern sequence of states in a test sequence of a test pattern is modified so as to achieve a circuit voltage that approximates the circuit voltages produced by the application of other portions of the test pattern sequence of states in the same or different test pattern sequences. Alternatively, an expected circuit voltage during actual operating conditions may be determined and used as a basis for modifying the test sequence of a test pattern so as to achieve a circuit voltage using the test sequence that approximates the expected circuit voltage during actual operating conditions. In other words, the deviation of the on-chip voltage (Vdd) response from a nominal on-chip voltage is minimized during test cycle sequences. In this way, false failures due to noise in the voltage supply may be removed from the testing as a source of failures. As a result, a more accurate determination of the Vminf is obtained.

In one illustrative embodiment, the modification to the test sequence is performed by inserting one or more hold state cycles into, or removing one or more hold state cycles from, the test sequence prior to test state cycles so as to modify the sequence of current draws prior to testing of the functional logic. The insertion/removal of hold state cycles does not change the actual testing of the functional logic of the integrated circuit device, but instead only alters the voltage response of the functional logic. The insertion/removal of the one or more hold state cycles allows the on-chip voltage to recover or rebound before additional current draws are required by the subsequent test state. As a result, the cumulative affect of current draws by the various states in the test sequence is lessened and voltage droops are minimized.

In an alternative illustrative embodiment, one or more scan-shift state cycles may be inserted into, or removed from, the test sequence rather than, or in addition to, inserting/removing hold state cycles. The scan-shift state cycles may be inserted/removed such that the on-chip voltage Vdd response to the current demand of the scan-shift state cycles partially cancels that of the test state cycles, thereby reducing the on-chip voltage Vdd droop. While the insertion/removal of scan-shift state cycles may modify the logic states applied to the functional logic of the integrated circuit device, this is not a problem since the scan state is pseudo-random in the first place.

The determination of where such hold/scan-shift state cycles should be inserted may be performed empirically using various measuring equipment or computationally using a model of the voltage response of the integrated circuit device, for example. For example, measuring equipment, such as may be provided in the testing equipment 330 of FIG. 3A, for example, may be used to measure the voltage response of the integrated circuit device along a voltage sense line of the integrated circuit device when test sequences are applied to the integrated circuit device using a logic built-in self test (LBIST) mechanism, as previously described above. From this voltage response measurement data, a voltage response waveform may be generated and used to determine where a voltage droop occurs due to power supply noise in the testing of the integrated circuit device. This location in the voltage response waveform may be used as a basis for inserting additional hold and/or scan-shift state cycles into the test pattern waveform generated by the LBIST controller, or removing hold/scan-shift state cycles from the test pattern waveform generated by the LBIST controller. Such modification of the test pattern waveform may be performed by the test equipment 330 by modifying the configuration bit string used to configure the LBIST controller such that additional NOOP state sequences or individual hold state cycles or scan-shift state cycles are added/removed just prior to a TEST state sequence in the test pattern waveform.

Alternatively, an integrated circuit device voltage response model may be developed for the integrated circuit device and used to simulate the voltage response of the integrated circuit device when various test sequences are applied. From this simulation, a similar voltage response waveform, as may be obtained from empirical embodiments, may be generated and used as a basis for determining locations in the test pattern waveform where hold/scan-shift state cycles should be inserted or removed. The modified test pattern waveform may then be used to reapply the test pattern to the integrated circuit device or used to test other similar integrated circuit devices.

Essentially, the goal is to obtain as much as possible a consistent voltage response across multiple test states of the same or different test sequence so as to minimize voltage droops that may give rise to false failures during testing. The insertion of each hold state cycle provides additional time between test states so as to provide the on-chip voltage with time to rebound. The removal of hold state cycles shifts the test state cycles so as to be closer to being coincident with a maximum or peak rebound of the on-chip voltage (Vdd) response to prior state cycle current draws. The insertion or removal of each scan-shift state cycle provides a partial cancellation of the on-chip voltage (Vdd) response of subsequent test state cycles.

Figure 4:
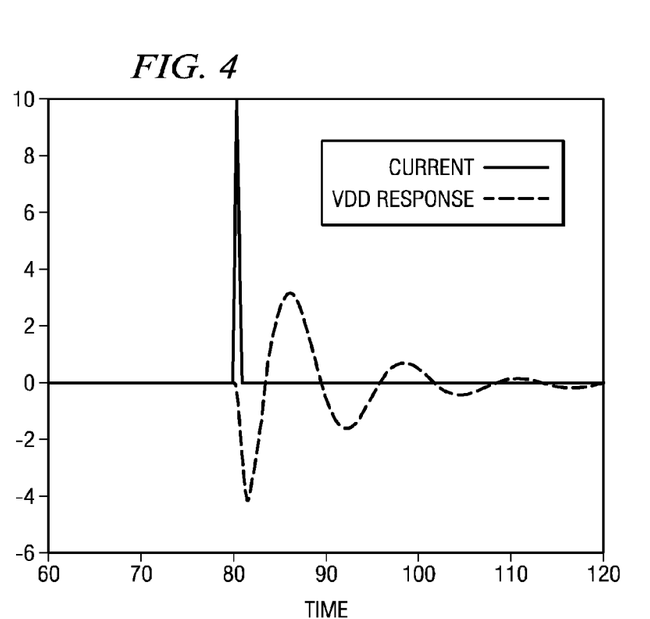
FIG. 4 is an exemplary diagram illustrating a single scan shift event and a resulting disturbance to on-chip voltage Vdd.
Figure 5:
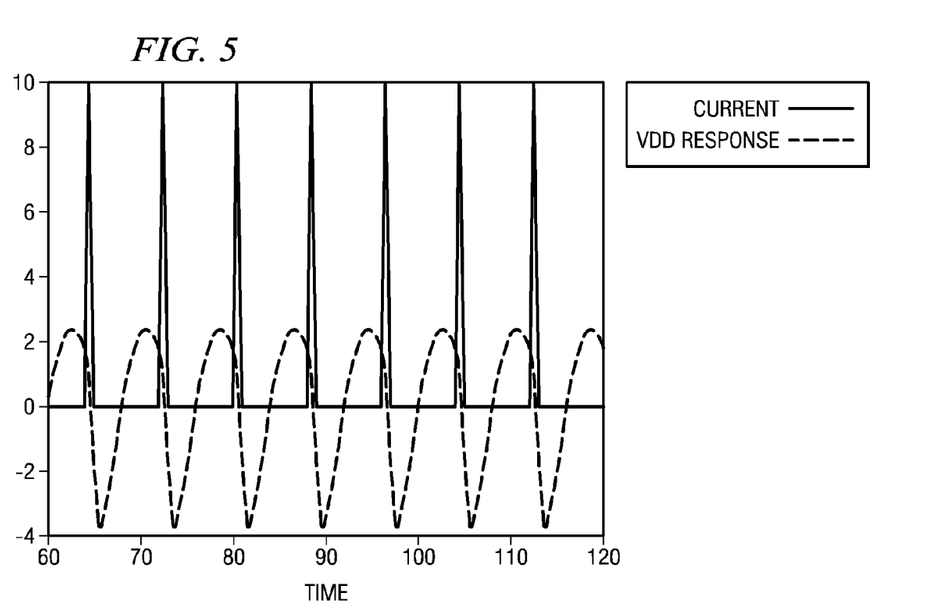
FIG. 5 is an exemplary diagram illustrating a steady state with a scan shift every eight cycle and the cumulative on-chip voltage Vdd response.

The mechanisms of the illustrative embodiments assume that the voltage response of an integrated circuit device may be modeled in terms of its impulse response. The impulse response is the time domain variation of the voltage applied to the integrated circuit device in response to a very brief unit current draw. An example plot of a single scan shift event and a resulting disturbance to on-chip voltage (Vdd) is depicted in FIG. 4. As shown in FIG. 4, at a time point 80 (i.e. the $80^{th}$ cycle), a current impulse occurs, and the on-chip voltage (Vdd) initially drops to a value of approximately −4 which levels out through the on-chip voltage (Vdd) response over approximately 40 cycles. FIG. 5 is an exemplary diagram illustrating a steady state with a scan shift event, such as that shown in FIG. 4, every eight cycles and the cumulative on-chip voltage (Vdd) response.

Because the impulse response of the on-chip voltage (Vdd) is non-zero for a significant amount of time after the current impulse, the on-chip voltage during a subsequent TEST state sequence is affected by the recent history of current demand, such as in the FILL state sequence and SCAN state sequence preceding the TEST state sequence, as well as the current demand produced by the TEST state sequence. These effects may combined to produce lower (or higher given an underdamped impulse response) than average on-chip voltages. This may result in higher (or lower) measured Vminf for the test pattern.

Figure 6:
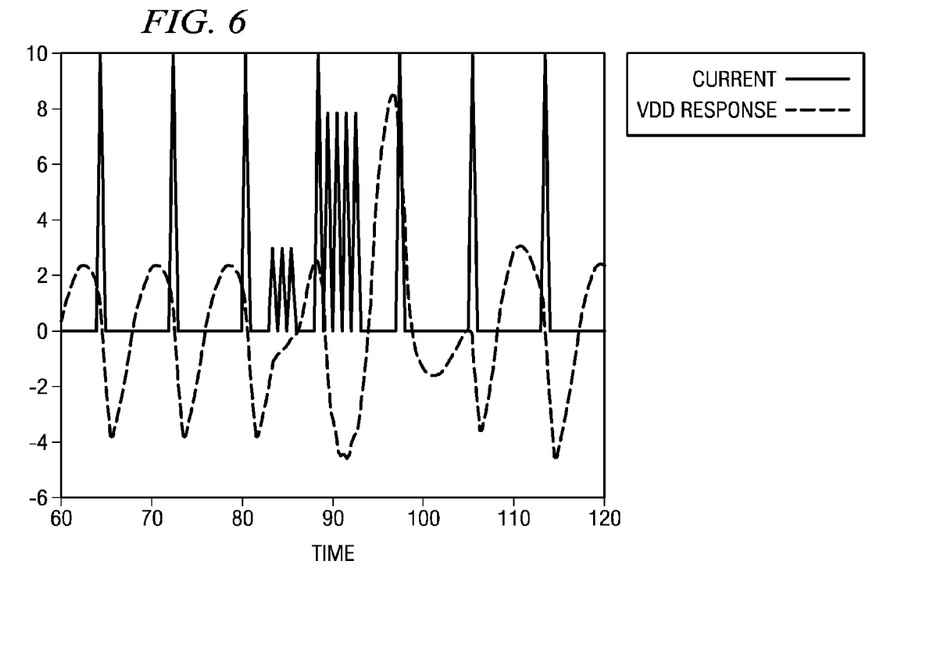
FIG. 6 is an exemplary diagram illustrating a test portion of an LBIST sequence.

To illustrate this affect on a TEST state sequence, FIG. 6 is provided as an exemplary diagram illustrating a test portion of an LBIST sequence. As shown in FIG. 6, the test pattern waveform starts with a steady-state scan, i.e. SCAN state sequence, every eighth cycle similar to that shown in FIG. 5 above. At approximately cycles 82-86, a FILL state sequence (i.e. [HFFFH]) occurs followed in cycles 88-93 by the TEST state sequence ([SAAAAH]), which is then followed by the beginning of the next SCAN state sequence. As can be seen in FIG. 6, the on-chip voltage (Vdd) response droops during the TEST state sequence in cycles 88-93 due to the current draws in the FILL state sequence of cycles 82-86.

In the depicted example of FIG. 6, the impulse response waveform has the on-chip voltage (Vdd) rebound peak 6 to 7 cycles after the event and the on-chip voltage (Vdd) falls until approximately 12 cycles after the event. In this case, the test state cycles (cycles 88-93) are in the "falling Vdd" portion of the on-chip voltage response waveform to the non-scan flush events. Thus, the non-scan flush contributes to the on-chip voltage (Vdd) falling during the test state cycles. By removing some of the hold cycles prior to the test state cycles, the test state cycle sequence occurs 3 to 8 cycles after the non-scan flush event of the previous test state cycle sequence which puts the test state cycle sequence nearer to the maximum or peak on-chip voltage (Vdd) rebound from the non-scan flush event. As a result, the on-chip voltage (Vdd) droop during the test state cycles due to the prior state cycles is minimized and the on-chip voltage (Vdd) response is made closer to a nominal on-chip voltage.

With the mechanisms of the illustrative embodiments, an on-chip voltage response waveform such as that shown in FIG. 6 may be obtained either through simulation or empirical testing of an integrated circuit device. This on-chip voltage response waveform may be analyzed by the testing equipment, such as by a test sequence modification unit 339 in FIG. 3A, to identify the fact that the on-chip voltage response of the TEST state sequence in cycles 88-93 has drooped due to current demands from an earlier state sequence. Thus, hold/scan-shift cycles may be inserted into/removed from the test pattern waveform in order to shift the TEST state sequence relative to the earlier FILL or SCAN state sequences. As a result, the on-chip voltage response is modified so as to minimize the droop observed during the TEST state sequence.

Figure 7:
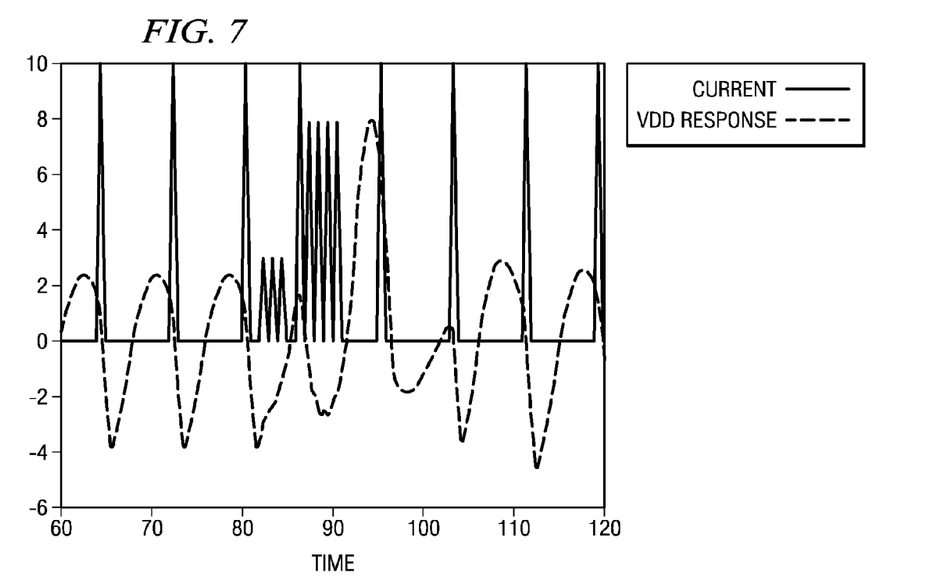
FIG. 7 is an exemplary diagram illustrating a test portion of a modified LBIST test sequence in which additional hold cycles are inserted in accordance with one illustrative embodiment.

FIG. 7 is an exemplary diagram illustrating a test portion of a modified LBIST test sequence in which hold cycles are removed in accordance with one illustrative embodiment. As shown in FIG. 7, some of the hold cycles prior to the TEST state sequence have been removed. While the on-chip voltage Vdd still droops during the TEST state sequence, the droop is not as significant as in the example shown in FIG. 6. Thus, by removing hold cycles, the on-chip voltage response of the TEST state sequence is made less dependent upon the current draws and voltage response of earlier state sequences. By modifying the on-chip voltage response during the TEST state sequence so as to cancel or reduce the affects of prior state sequences, the measurement of Vminf during the TEST state sequence is made less dependent upon the earlier state sequences. Hence a more accurate determination of Vminf due to the actual test cycles applied to the integrated circuit device may be obtained.

Figure 8:
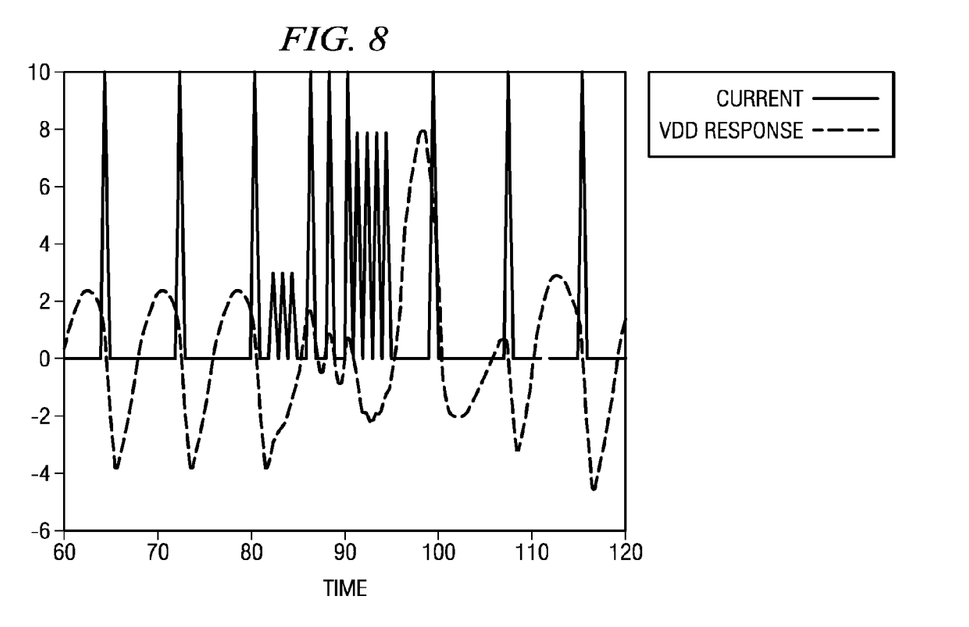
FIG. 8 is an exemplary diagram illustrating a test portion of a test portion of a modified LBIST test sequence in which additional scan cycles are inserted in accordance with one illustrative embodiment.

As described above, another option for modifying the test pattern waveform is to insert (or remove) scan-shift cycles, or SCAN state sequences. FIG. 8 is an exemplary diagram illustrating a test portion of a test portion of a modified LBIST test sequence in which additional scan-shift cycles are inserted in accordance with one illustrative embodiment. In FIG. 8, the additional scan-shift cycles are shown as impulse current draws prior to the TEST state sequence starting at approximately cycle 90, and after the FILL state sequence starting at approximately cycle 82. As shown in FIG. 8, the additional scan-shift cycles affect the subsequent on-chip voltage Vdd response during the TEST state sequence so as to reduce the droop experienced during the TEST state sequence. The on-chip voltage Vdd response due to the current demands of these additional scan-shift cycles partially cancel that of the TEST state sequence. As a result, false failures of tests due to higher than average droops in on-chip voltage Vdd response are minimized.

Thus, the illustrative embodiments provide mechanisms for modifying a test pattern waveform so as to reduce the affects of prior state sequences or state cycles on TEST state sequences or test cycles of an integrated circuit device. With the mechanisms of the illustrative embodiments, a test pattern waveform may be applied to the integrated circuit device, such as via an LBIST testing mechanism or simulation, and the on-chip voltage response may be measured/calculated. From this on-chip voltage response, areas where voltage droops occur in TEST state sequences due to prior state sequences or state cycles may be identified. Additional hold state cycles and/or scan-shift state cycles may be inserted prior to the TEST state sequences or hold state cycles and/or scan-shift state cycles may be removed prior to the TEST state sequences so as to modify the affect on the on-chip voltage Vdd response during the TEST state sequences. The modified TEST state sequences may then be applied to the integrated circuit device to thereby test the integrated circuit device and determine a Vminf.

Figure 9:
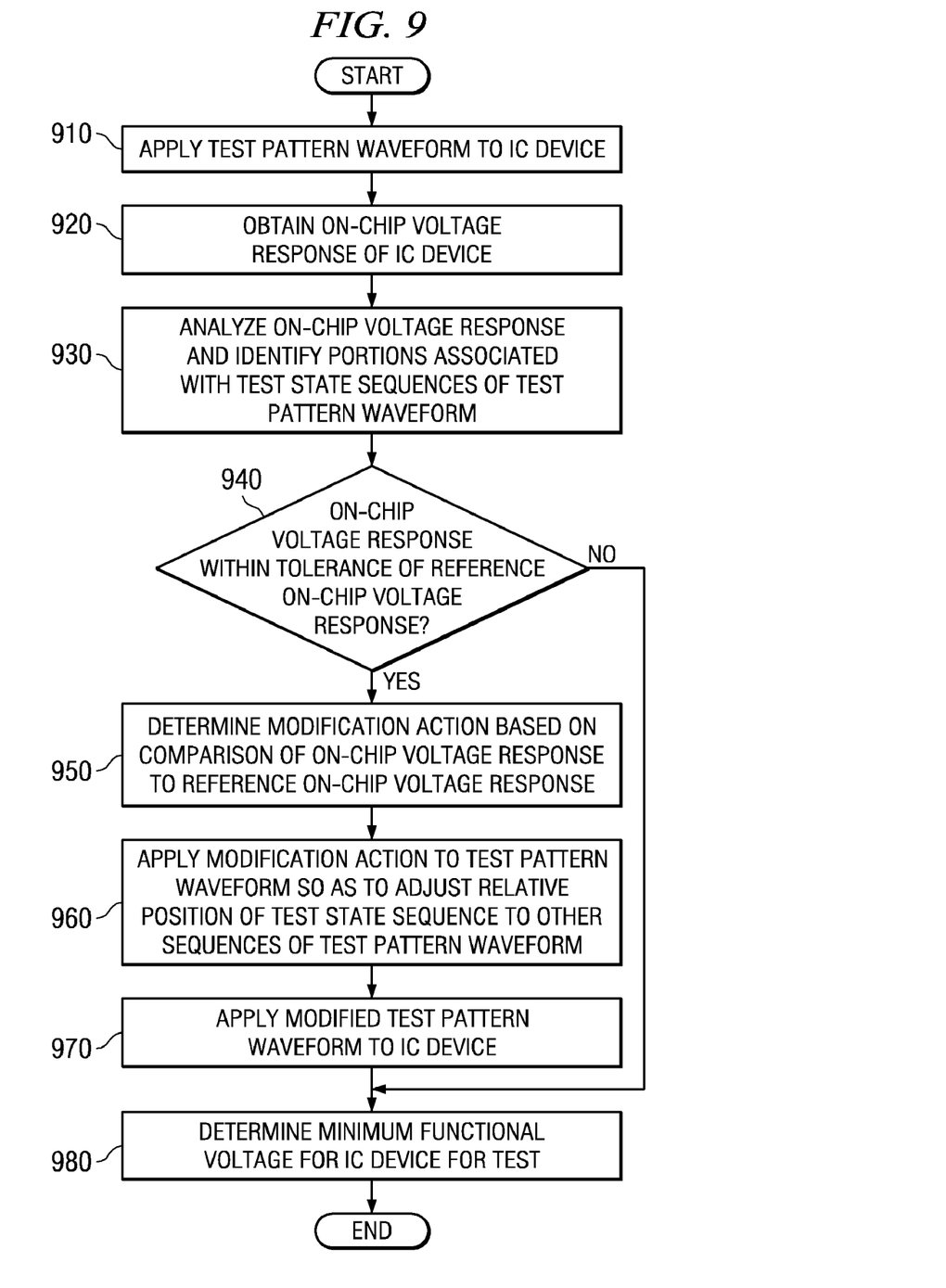
FIG. 9 is a flowchart outlining an exemplary operation of one illustrative embodiment.

FIG. 9 is a flowchart outlining an exemplary operation of one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

The operation outlined in FIG. 9 may be performed, for example, in testing equipment that empirically tests the operation of a fabricated integrated circuit device. Alternatively, the operation outlined in FIG. 9 may be implemented in a simulation of an integrated circuit device using a logic model of the integrated circuit device and a voltage response model of the integrated circuit device.

As shown in FIG. 9, the operation starts with testing equipment (or simulation) applying a test pattern waveform to an integrated circuit device (step 910). The testing equipment (or simulation) measures or calculates the on-chip voltage response of the integrated circuit device to the application of the test pattern waveform (step 920). The testing equipment (or simulation) analyzes the on-chip voltage response and identifies portions of the on-chip voltage response waveform that corresponds to test state sequences of the test pattern waveform (step 930). The on-chip voltage response in these portions of the on-chip voltage response waveform is analyzed by the testing equipment (or simulation) to determine if the on-chip voltage response is within a predetermined tolerance of a reference on-chip voltage response (step 940). This reference on-chip voltage response may be an average on-chip voltage response, an expected on-chip voltage response, an on-chip voltage response of a similar test on a different integrated circuit device, or any other reference on-chip voltage that is determined to be appropriate for the particular implementation.

If the on-chip voltage response is outside the predetermined tolerance of the reference on-chip voltage, then the testing equipment (or simulation) determines a modification action for modifying the test pattern waveform (step 950). The testing equipment (or simulation) may then apply the modification action to the test pattern waveform so as to adjust the relative position of the test state sequence with regard to prior state sequences in the test pattern waveform (step 960). The testing equipment (or simulation) may then apply the modified test pattern waveform to the integrated circuit device (step 970) and the determine a minimum functional voltage for the integrated circuit device (step 980). The operation then terminates.

It should be appreciated that the modification of the test pattern waveform may be performed iteratively until a desired on-chip voltage response during test state sequences is achieved. Thus, for example, the test pattern waveform may be modified by the mechanisms of the illustrative embodiments until all on-chip voltage drops of test state sequences in the test pattern waveform are within a given tolerance of a reference on-chip voltage. Moreover, when performing the operations of the illustrative embodiments during simulation, the resulting modified test pattern waveform may then be used to physically test fabricated integrated circuit devices.

Thus, the mechanisms of the illustrative embodiments provide for the modification of test patterns so as to minimize noise in the power supply voltage during test state sequences. As a result, test state sequences do not falsely identify a failure of the integrated circuit device due to voltage droops below a threshold voltage. Hence a more accurate determination of Vminf during the test state sequences may be obtained.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—ead/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for testing an integrated circuit device, comprising:
    determining a voltage response of the integrated circuit device to a test state sequence;
    modifying a test pattern waveform, by modifying a configuration bit string provided as an input to a logic built-in self test controller associated with the integrated circuit device, based on the determined voltage response so as to reduce noise in the voltage response during the test state sequence;
    applying the modified test pattern waveform to the integrated circuit device; and
    determining a minimum functional voltage for the integrated circuit device based on the application of the modified test pattern waveform.

2. The method of claim 1, wherein modifying a test pattern waveform based on the determined voltage response and applying the modified test pattern waveform to the integrated circuit device is performed repeatedly in an empirical manner until a desired voltage response for the test state sequence is obtained.

3. The method of claim 1, wherein modifying a test pattern waveform comprises at least one of inserting one or more hold state cycles prior to the test state sequence in the test pattern waveform, inserting one or more scan-shift state cycles prior to the test state sequence in the test pattern waveform, removing one or more hold state cycles prior to the test state sequence in the test pattern waveform, or removing one or more scan-shift state cycles prior to the test state sequence in the test pattern waveform.

4. The method of claim 1, wherein the determining and modifying steps are performed using a model of the integrated circuit device and a simulation of the operation of the integrated circuit device using the model.

5. The method of claim 1, wherein modifying a test pattern waveform comprises inserting or removing hold state cycles or scan-shift state cycles prior to the test state sequence in the test pattern waveform based on whether the test state sequence in the test pattern waveform starts prior to or after a peak voltage response in the determined voltage response.

6. The method of claim 1, wherein the voltage response to the test state sequence is determined in response to application of a test pattern using logic built-in self test (LBIST) logic provided on the integrated circuit device.

7. The method of claim 1, wherein modifying a test pattern waveform comprises determining cycles to insert prior to the test state sequence in the test pattern waveform so as to minimize a deviation of the determined voltage response from a nominal voltage.

8. The method of claim 7, wherein the nominal voltage is determined based on one of a voltage response of a prior test state sequence of the test pattern waveform, a voltage response of a test state sequence of another test pattern waveform, or a pre-determined nominal voltage response.

9. The method of claim 1, wherein modifying a test pattern waveform comprises computationally determining a type and number of state cycles to insert into or remove from the test pattern waveform based on an impulse response modeling of the integrated circuit device.

10. The method of claim 1, wherein modifying a test pattern waveform comprises inserting one or more hold state cycles prior to the test state sequence in the test pattern waveform in response to a determination that the test state sequence occurs before the voltage response has reached a peak voltage.

11. The method of claim 1, wherein modifying a test pattern waveform comprises removing one or more hold state cycles prior to the test state sequence in the test pattern waveform in response to a determination that the test state sequence occurs after the voltage response has rebounded to a peak voltage.

12. The method of claim 1, wherein modifying a test pattern waveform comprises inserting or removing one or more scan-shift state cycles such that a voltage response to a current demand of the one or more scan-shift state cycles partially cancels a current demand of test state cycles associated with the test state sequence.

13. A computer program product comprising a computer useable storage medium having a computer readable program stored thereon, wherein the computer readable program, when executed on a computing device, causes the computing device to:
determine a voltage response of an integrated circuit device to a test state sequence;
modify a test pattern waveform, by modifying a configuration bit string provided as an input to a logic built-in self test controller associated with the integrated circuit device, based on the determined voltage response so as to reduce noise in the voltage response during the test state sequence;
apply the modified test pattern waveform to the integrated circuit device; and
determine a minimum functional voltage for the integrated circuit device based on the application of the modified test pattern waveform.

14. The computer program product of claim 13, wherein the computer readable program causes the computing device to modify a test pattern waveform based on the determined voltage response and apply the modified test pattern waveform to the integrated circuit device repeatedly in an empirical manner until a desired voltage response for the test state sequence is obtained.

15. The computer program product of claim 13, wherein the computer readable program causes the computing device to modify a test pattern waveform by at least one of inserting one or more hold state cycles prior to the test state sequence in the test pattern waveform, inserting one or more scan-shift state cycles prior to the test state sequence in the test pattern waveform, removing one or more hold state cycles prior to the test state sequence in the test pattern waveform, or removing one or more scan-shift state cycles prior to the test state sequence in the test pattern waveform.

16. The computer program product of claim 13, wherein the computer readable program causes the computing device to modify a test pattern waveform by inserting or removing hold state cycles or scan-shift state cycles prior to the test state sequence in the test pattern waveform based on whether the test state sequence in the test pattern waveform starts prior to or after a peak voltage response in the determined voltage response.

17. The computer program product of claim 13, wherein the voltage response to the test state sequence is determined in response to application of a test pattern using logic built-in self test (LBIST) logic provided on the integrated circuit device.

18. The computer program product of claim 13, wherein the computer readable program causes the computing device to modify a test pattern waveform by determining cycles to insert prior to the test state sequence in the test pattern waveform so as to minimize a deviation of the determined voltage response from a nominal voltage.

19. The computer program product of claim 18, wherein the nominal voltage is determined based on one of a voltage response of a prior test state sequence of the test pattern waveform, a voltage response of a test state sequence of another test pattern waveform, or a pre-determined nominal voltage response.

20. The computer program product of claim 13, wherein the computer readable program causes the computing device to modify a test pattern waveform by computationally determining a type and number of state cycles to insert into or remove from the test pattern waveform based on an impulse response modeling of the integrated circuit device.

21. An apparatus, comprising:
a processor; and
a memory coupled to the processor, the memory comprising instructions which, when executed by the processor, cause the processor to:
determine a voltage response of an integrated circuit device to a test state sequence;
modify a test pattern waveform, by modifying a configuration bit string provided as an input to a logic built-in self test controller associated with the integrated circuit device, based on the determined voltage response so as to reduce noise in the voltage response during the test state sequence;
apply the modified test pattern waveform to the integrated circuit device; and
determine a minimum functional voltage for the integrated circuit device based on the application of the modified test pattern waveform.

* * * * *